US 9,209,118 B2

(12) United States Patent
Cuoco et al.

(10) Patent No.: US 9,209,118 B2
(45) Date of Patent: Dec. 8, 2015

(54) INTEGRATED CIRCUIT ARRANGEMENT

(71) Applicant: NXP B.V., Eindhoven (NL)

(72) Inventors: Vittorio Cuoco, Nijmegen (NL); Albert van Zuijlen, Nijmegen (NL); Josephus van der Zanden, Nijmegen (NL)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 14/658,479

(22) Filed: Mar. 16, 2015

(65) Prior Publication Data
US 2015/0270198 A1    Sep. 24, 2015

(30) Foreign Application Priority Data

Mar. 24, 2014    (EP) .................................... 14161346

(51) Int. Cl.
*H01L 23/495*    (2006.01)
(52) U.S. Cl.
CPC .... *H01L 23/49541* (2013.01); *H01L 23/49517* (2013.01)
(58) Field of Classification Search
USPC ......... 257/276, 625, 675, 706, 707, 712–722, 257/731, 732, E31.131, E23.08–E23.113; 174/535, 548; 361/679.46, 679.54, 361/702, 831; 438/122
See application file for complete search history.

(56) References Cited

U.S. PATENT DOCUMENTS

| 7,083,311 | B2 * | 8/2006 | Schreck et al. ............... 362/487 |
| 8,643,158 | B2 * | 2/2014 | Liu et al. ....................... 257/676 |
| 2013/0017652 | A1 | 1/2013 | Tsui et al. |

FOREIGN PATENT DOCUMENTS

| EP | 2 605 276 A2 | 6/2013 |
| WO | 97/50128 | 12/1997 |

OTHER PUBLICATIONS

Extended European Search Report for Application No. 14161346.3 (Oct. 2, 2014).

* cited by examiner

*Primary Examiner* — Jasmine Clark

(57) ABSTRACT

An integrated circuit arrangement comprising a substrate and a flange disposed on top of the substrate. The flange comprises a cantilever portion configured to project over the substrate. A die disposed on top of the flange. A first output terminal disposed on the substrate. A first lead configured to provide for an electrical connection between the die and the first output terminal. A first electrically conducting member configured to provide at least part of a current return path between the substrate and the die and arranged to bridge a gap between the cantilever portion and the substrate. The first electrically conducting member is disposed between the die and the first output terminal and is configured to enable electrical current to flow from the substrate to the cantilever portion of the flange.

15 Claims, 6 Drawing Sheets

INTEGRATED CIRCUIT ARRANGEMENT

CROSS-REFERENCE TO RELATED APPLICATIONS

This application claims the priority under 35 U.S.C. §119 of European patent application no. 14161346.3, filed on Mar. 24, 2015, the contents of which are incorporated by reference herein.

This disclosure relates to integrated circuit arrangements that include active components such transistors and/or amplifiers, and relates to the configuration of the current return paths in such arrangements.

A first aspect of the invention provides an integrated circuit arrangement, for use with a substrate, comprising: a flange for disposition on top of the substrate, the flange comprising a cantilever portion configured to project over the substrate; a die disposed on top of the flange; a first lead configured to provide for an electrical connection between the die and a first output terminal disposed on the substrate; and a first electrically conducting member configured to provide at least part of a current return path between the substrate and the die and arranged to bridge a gap between the cantilever portion and the substrate.

The first conducting member may reduce the inductance of the integrated circuit arrangement and may increase the efficiency of the integrated circuit arrangement. The first conducting member may reduce the impedance of the integrated circuit arrangement and may thereby increase the efficiency of the integrated circuit arrangement.

This may be advantageous as the electrically conducting member may assist current flow between the substrate and flange while allowing the cantilever portion to provide a mechanical locking point between the arrangement and an Over Moulded Plastic (OMP) packaging.

The substrate may comprise a heat sink portion and a Printed Circuit Board portion adjacent to the heat sink portion. The flange may be disposed on top of the heat sink portion and the cantilever portion may be configured to project over the Printed Circuit Board portion. The first electrically conducting member may be configured to extend through the Printed Circuit Board portion to the cantilever portion.

Alternatively, the flange may be disposed on top of the heat sink portion and the cantilever portion may be configured to project over the heat sink portion. The first electrically conducting member may be configured to extend between the heat sink portion and the cantilever portion.

The cantilever portion may comprise a proximal end, adjacent to the die, and a distal end, adjacent to the first output terminal, and the first electrically conducting member may be electrically coupled to the distal end of the cantilever portion.

The first electrically conducting member may comprise a strip of conductive material, extending along the distal end of the cantilever portion of the flange.

The first electrically conducting member may comprise a plurality of pins of conductive material, extending along the distal end of the cantilever portion of the flange.

The first electrically conducting member may comprise a strip of conductive material having indentations. The indented strip may extending along the distal end of the cantilever portion of the flange.

The conductive material may comprise a metal.

The integrated circuit arrangement may further comprise an Over-Moulded-Plastic package configured to encapsulate: the flange, including the cantilever portion of the flange; the die; at least a portion of the first lead; at least a portion of the first electrically conducting member. The encapsulation may provide for a gap between the Over-Moulded-Plastic package and the substrate.

Encapsulation of the flange may advantageously improve the mechanical locking of the Over-Moulded-Plastic package to the rest of the integrated circuit arrangement.

The integrated circuit arrangement may further comprise an Over-Moulded-Plastic package configured to encapsulate: the flange, including the cantilever portion of the flange; the die; at least a portion of the first lead; the first electrically conducting member. The encapsulation may provide direct contact between the Over-Moulded-Plastic package and the substrate.

The integrated circuit arrangement may further comprise: a second lead configured to provide a separate electrical connection between the die and a second output terminal disposed on the substrate remote from the first output terminal; a second electrically conducting member configured to provide at least part of a second current return path between the substrate and the die and arranged to bridge a gap between the cantilever portion and the substrate. The first electrically conducting member may be disposed between the die and the first output terminal and may be configured to enable electrical current to flow from the substrate to the cantilever portion of the flange and the second electrically conducting member may be disposed between the die and the second output terminal and may be configured to enable electrical current to flow from the substrate to the cantilever portion of the flange. This may be advantageous as the first electrically conductive member provides an efficient current return path for the first lead and the second electrically conductive member provides an efficient current return path for the second lead.

The integrated circuit arrangement may further comprise: a first active component disposed on the die, configured to supply and/or receive an electrical signal from the first lead; and a second active component disposed on the die, distinct from the first active component, configured to supply and/or receive an electrical signal from the second lead.

The first active component may comprise a transistor and/ or an amplifier. The second active component may comprise a transistor and/or an amplifier. The first electrically conducting member and the second electrically conducting member may be configured to electrically isolate the first active component from the second active component. It will be appreciated that the electrical isolation of the first active component from the second active component will not be absolute. However, an improvement in electrical isolation may advantageously improve the efficiency of the arrangement.

The integrated circuit arrangement may comprise a Doherty amplifier. The first active component may be configured to comprise a peak amplifier. The second active component may be configured to comprise a main amplifier.

There may be provided a Quad Flat No-leads (QFN) integrated circuit arrangement comprising any integrated circuit arrangement disclosed herein.

There may be provided a communications device, a radio-frequency device, a mobile device or a base-station device comprising any integrated circuit arrangement disclosed herein.

There may be provided an integrated circuit package comprising the integrated circuit arrangement of the first aspect, the first lead configured to connect to a first output terminal on a substrate and the first electrically conducting member configured to project from the package and connect to a current return terminal on the substrate.

The current return terminal may comprise include a via extending through the substrate.

BRIEF DESCRIPTION OF THE DRAWINGS

Examples of the invention will now be described in detail with reference to the accompanying figures, in which.

DETAILED DESCRIPTION

An integrated circuit arrangement may comprise a flange disposed on a substrate and a die disposed on the flange. The active components of the integrated circuit may include transistors and/or amplifiers. The active components may be disposed on the die. The substrate may comprise a printed circuit board (PCB) portion and a heat sink portion, disposed adjacent to the PCB portion.

The flange may be disposed on the heat sink portion of the substrate and may be in direct contact with the heat sink portion. The flange may have a cantilever portion, configured to project over the substrate such that a gap is formed between the substrate and the cantilever portion. The cantilever portion may project over a part of the heat sink portion of the substrate, or the cantilever portion may project over a part of the PCB portion of the substrate, or the cantilever portion may project over both a part of the heat sink portion and a part of the PCB portion of the substrate.

The integrated circuit arrangement may have an output terminal disposed on the substrate. The output terminal may be electrically coupled, to the die, by a lead and a bond wire. In use, electrical current may flow from the die to the output terminal through the bond wire and the lead. In use, therefore, electrical current will need to flow through a return path, from the substrate, back to the die. This disclosure relates to improvements in the design of current return paths in integrated circuit arrangements.

Figure 1:
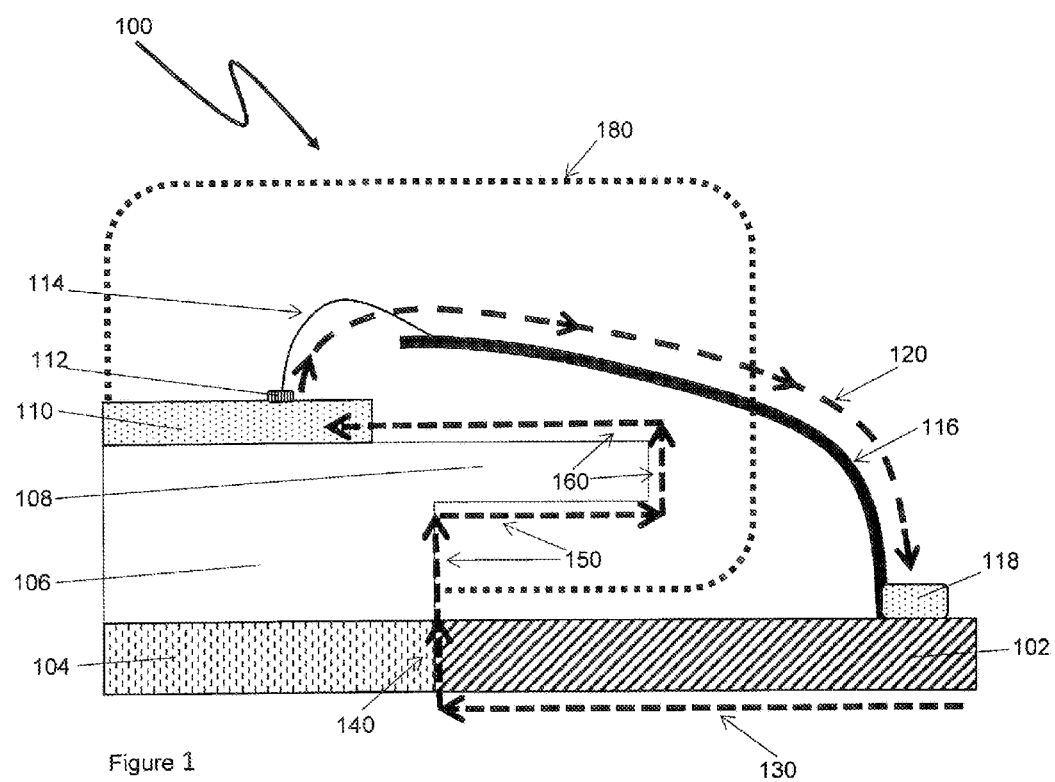
FIG. 1 shows a cross section view of part of an integrated circuit arrangement including the forward and return current paths.

FIG. 1 shows a cross section view of part of an integrated circuit arrangement 100. In this example, the substrate comprises a PCB portion 102 disposed adjacent to a heat sink portion 104. A flange 106 is disposed on top of the heat sink portion 104 of the substrate. The flange 106 has a cantilever portion 108 that projects over the PCB portion 102 of the substrate. A die 110 is disposed on top of the flange 106. The die 110 comprises a die output terminal 112. The die output terminal 112 is electrically connected, via a bond wire 114, to a lead 116 that is electrically connected to an output terminal 118 disposed on the PCB portion 102 of the substrate.

In use, an electrical current, or electrical signal, will flow between the die output terminal 112 and the output terminal 118 through the bond wire 114 and the lead 116. This flow may be in the direction illustrated by the dashed line 120. In the example provided reference is made to a lead that provides an output for the integrated circuit. However, it will be appreciated that the arrangement described could apply at an input to the integrated circuit.

In use, an electrical current, or electrical signal, will flow through a return path. The PCB return path 130 extends from the PCB ground to the heat sink portion 104 of the substrate. The heat sink return path 140 extends through the substrate, between the heat sink portion 104 and the PCB portion 102. The flange return path comprises two parts. In a first flange return path 150 current flows around the underside of flange 106 and the underside of the cantilever portion 108 of the flange 106. In a second flange return path 160 current flows around the upper surface of the cantilever portion 108 of the flange 106 and the upper portion of the flange 106. This enables the return path to supply return current back to the die 110 so as to complete the circuit.

It will be appreciated that integrated circuit arrangements can operate in the gigahertz frequency range. It will be further appreciated that at gigahertz frequencies, the return current path will be limited to the surface regions of the conducting components of the arrangement, due to the skin effect. Therefore, in FIG. 1c the dotted lines 130, 140, 150, 160 that indicate direction of the current return path are shown close to the relevant surfaces.

The dotted line 180 shows the exterior envelope of an Over-Mould-Plastic (OMP) package. This OMP package comprises a plastic material that encapsulates the components of the integrated circuit arrangement to provide mechanical support and protection from the environment. A purpose of the cantilever portion 108 of the flange 106 is to improve mechanical locking of the OMP package to the integrated circuit arrangement. The lead 116 is configured to exit the OMP package 180 to make electrical contact with the output terminal 118. It will be appreciated that the OMP package may be configured to provide for a gap between the OMP package and the substrate, as shown in FIG. 1. It will also be appreciated that the OMP package may be configured to be in direct contact with the substrate (not shown).

Figure 2:
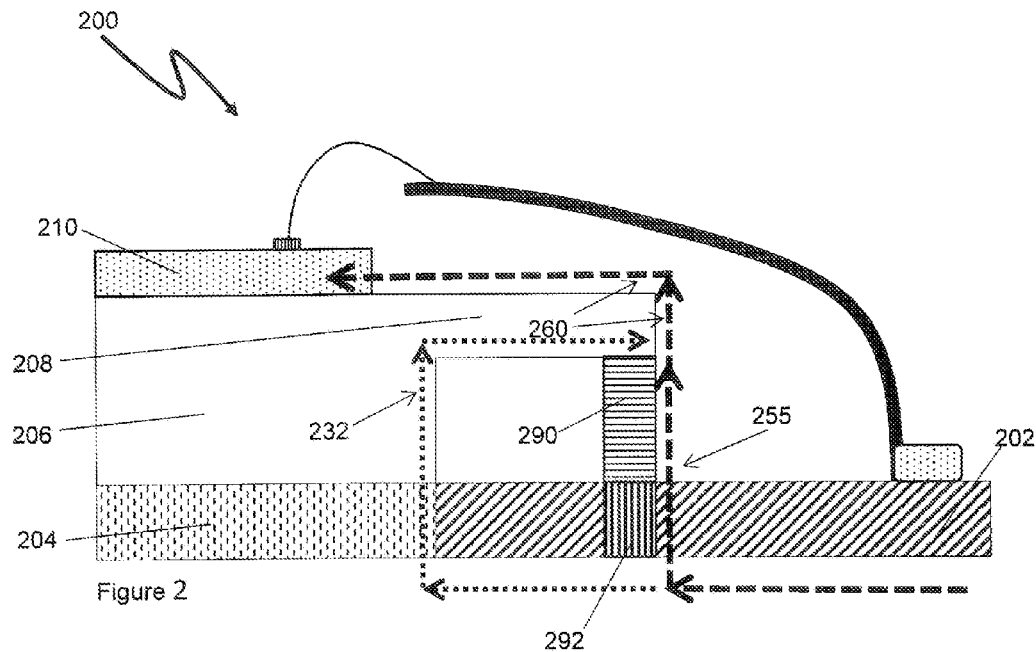
FIG. 2 shows a cross section view of part of an integrated circuit arrangement with a shortened return current path.

FIG. 2 shows a cross section view of part of an integrated circuit arrangement 200 with an electrically conducting member providing part of a current return path. Features in FIG. 2 that are similar to features in FIG. 1 have been given corresponding reference numerals and will not necessarily be described here to assist in the clarity of the disclosure. Illustration of the OMP package has also been omitted to improve the clarity of the disclosure.

The integrated circuit arrangement 200 further comprises an electrically conducting member 290 configured to provide an electrical connection between the substrate and the cantilever portion 208 of the flange 206. In this example the electrically conducting member 290 connects the PCB portion 202 of the substrate to the cantilever portion 208 thereby bridging the gap between the substrate and the cantilever portion. The current return path therefore forms a shortening portion 255 that enables current to flow from the PCB portion 202, through the electrically conducting member 290, to the cantilever portion 208. The current return path then continues via a second flange return path 260 in which current flows around the upper surface of the cantilever portion 208 and the upper portion of the flange 206 to enable the return of current to the die 210. Spaced from the heat sink portion 204, at a distal end of the cantilever portion 208, member 290 may comprise a bar extending between the cantilever portion 208 that is configured to connect to a via 292 that extends through the PCB portion 202.

It will be appreciated that the inclusion of the electrically conducting member 290 shortens the current return path. The electrically conducting member 290 projects from a point that is spaced from a proximal end of the cantilever portion, towards the distal end. The current return path does not extend to the heat sink portion 204 of the substrate and does not loop around the underside of the flange 250. The electrically conducting member 290 therefore provides an alternative current pathway that avoids a current return path loop 232. By avoiding the need for current to traverse the current return path loop 232 the impedance of the integrated circuit arrangement 200 may be reduced. In particular, the inductance of the integrated circuit arrangement 200 may be reduced. A reduction in the inductance of the integrated circuit arrangement 200 may advantageously provide an improvement in electrical efficiency. The electrically conducting member may thus project from the package that surrounds the integrated circuit arrangement and may form a current return terminal for connection to an appropriate point or terminal on the substrate.

The reduction in the length of the return path may advantageously provide a reduction in the electrical resistance and/or impedance of the integrated circuit arrangement. Reductions in the electrical impedance of the integrated circuit may provide the advantage of reducing losses of electrical power through its conversion into heat. A reduction in heating effects may advantageously reduce the cost and complexity of heat management systems required for use with the integrated circuit arrangement 200.

Figure 3:
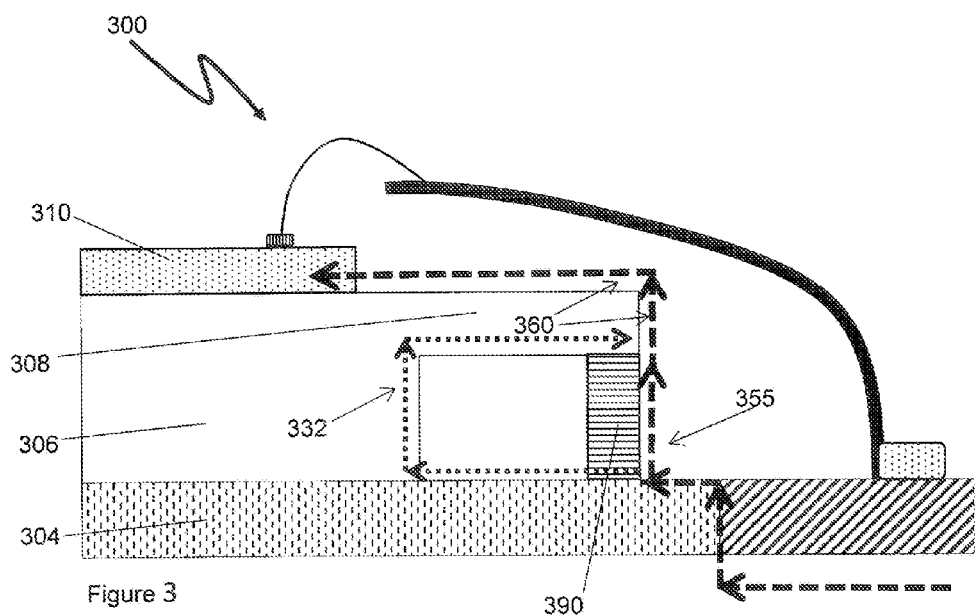
FIG. 3 shows a cross section view of part of an integrated circuit arrangement with an alternative shortened return current path.

FIG. 3 shows a cross section view of part of an integrated circuit arrangement 300 with an electrically conductive member configured to provide part of a current return path. Features in FIG. 3 that are similar to features in FIG. 1 have been given corresponding reference numerals and will not necessarily be described here to assist in the clarity of the disclosure. Illustration of the OMP has also been omitted to improve the clarity of the disclosure.

In the integrated circuit arrangement 300 the heat sink portion 304 of the substrate extends beyond the end of the cantilever portion 308 of the flange 306. Therefore, to provide a connection between the substrate and the cantilever portion 308, the integrated circuit arrangement 300 further comprises an electrically conducting member 390 disposed between the cantilever portion 308 and the heat sink portion 304. The current return path therefore comprises a shortening portion 355 that enables current to flow from the heat sink portion 304, through the electrically conducting member 390, to the cantilever portion 308. The current return path then continues via a second flange return path 360 in which current flows around the upper surface of the cantilever portion 308 and the upper portion of the flange 306 to enable the return of current to the die 310.

It will be appreciated that the inclusion of the electrically conducting member 390 shortens the current return path. The electrically conducting member 390 therefore provides an alternative current pathway that avoids a current return path loop 332. By avoiding the need for current to traverse the current return path loop 332 the impedance of the integrated circuit arrangement 300 may be reduced. This reduction in impedance may include a reduction in inductance and/or a reduction in resistance. This alternative current return path may provide the same advantages as in the case of the integrated circuit arrangement 200 disclosed above in relation to FIG. 2. As in FIG. 2, the electrically conducting member may be configured to project from the packaged integrated circuit arrangement 300 and connect to the heat sink portion 304 of the substrate.

It will be appreciated that the OMP package, not shown in FIG. 3, may be configured to leave a gap between the portion of the OMP package closest to the substrate and the substrate itself as shown in FIG. 1. It will also be appreciated that the OMP package may be configured to be in direct contact with the substrate. In this latter case, the electrically conducting member 390 will not protrude outside of the OMP package, but will still be in electrical contact with the heat sink portion 304.

Figure 4A:
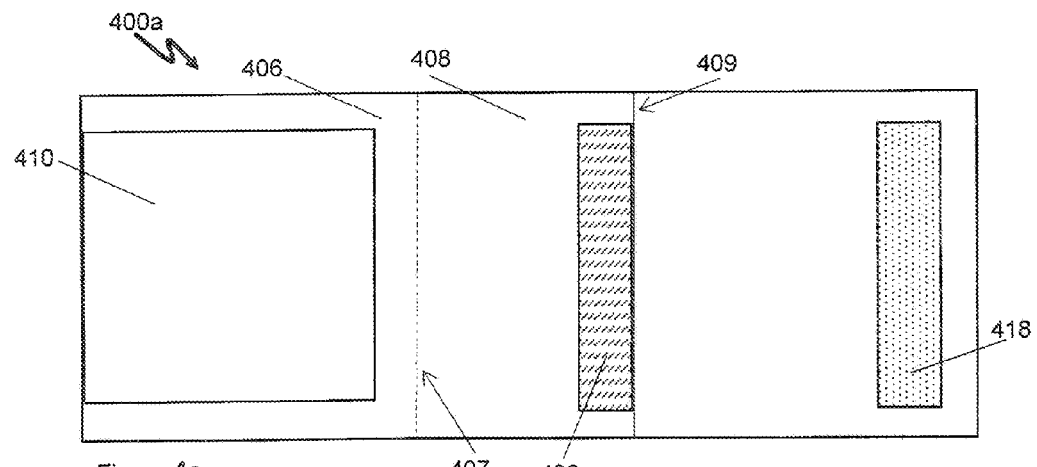
FIG. 4a shows a plan view of an integrated circuit arrangement with a solid metal strip configured to shorten the current return path.

FIG. 4a shows a plan view of an integrated circuit arrangement 400a that corresponds to cross section views of FIGS. 2 and 3. The lead, bond wires and certain other components are not shown to aid the clarity of the disclosure. The integrated circuit arrangement 400a comprises an output terminal 418 disposed on a substrate, a flange 406 disposed on the substrate, and a die 410 disposed on the flange 406. The flange 406 comprises a cantilever portion 408 configured to project over the substrate. A dotted line 407 indicates where the cantilever portion 408 begins to project from the rest of the flange 406. A solid line 409 indicates where the distal end of the cantilever portion 408 stops projecting over the substrate. An electrically conducting member 490a is disposed under the cantilever portion 408 such that it provides a current return path that electrically connects the substrate to the cantilever portion 408. In FIG. 4a the electrically conducting member 490a comprises a single continuous strip of conductive material that extends approximately the same length across the substrate (in the vertical direction as illustrated) as the output terminal 418 and the die 410. It will be appreciated that the conductive material of the conducting member 490 may comprise metal. In other examples, the conductive material may comprise non-metal material such as carbon nanotubes.

Figure 4B:
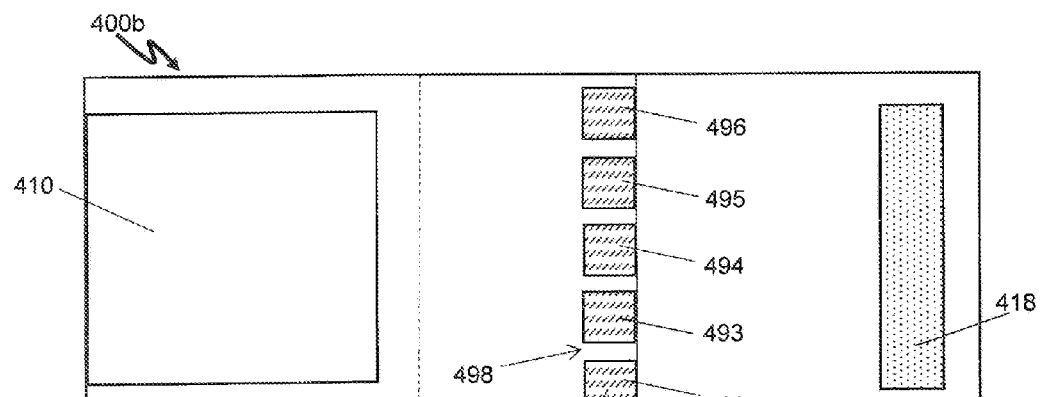
FIG. 4b shows a plan view of an integrated circuit arrangement with a plurality of metal pins configured to shorten the current return path.

FIG. 4b shows a plan view of another example of an integrated circuit arrangement 400b that corresponds to cross section views of FIGS. 2 and 3. In this example, the electrically conducting member 490b comprises a plurality of separate electrically conducting pins 492, 493, 494, 495, 496 that may extend approximately the same length across the substrate (in the vertical direction as illustrated) as the output terminal 418 and the die 410. FIG. 4b shows an arrangement in which the electrically conducting member comprises five electrically conducting pins, however, it will be appreciated that the plurality may comprise two or more pins. Each adjacent pair of pins is configured to provide a gap, for example a gap 498 is provided between a first pin 492 and a second pin 493. An OMP package (not shown) may be configured to partially fill the gaps between the pins. In another example, an OMP package (not shown) may be configured to completely fill the gaps between the pins. In an example in which an OMP package is present between the pins the integrated circuit arrangement 400*b* may advantageously have improved mechanical locking of the OMP package to the rest of the integrated circuit arrangement 400*b*. Thus, each of the pins 492-496 may project from the packaged integrated circuit arrangement 400*b* and form a current return terminal for connection to the substrate.

Figure 4C:
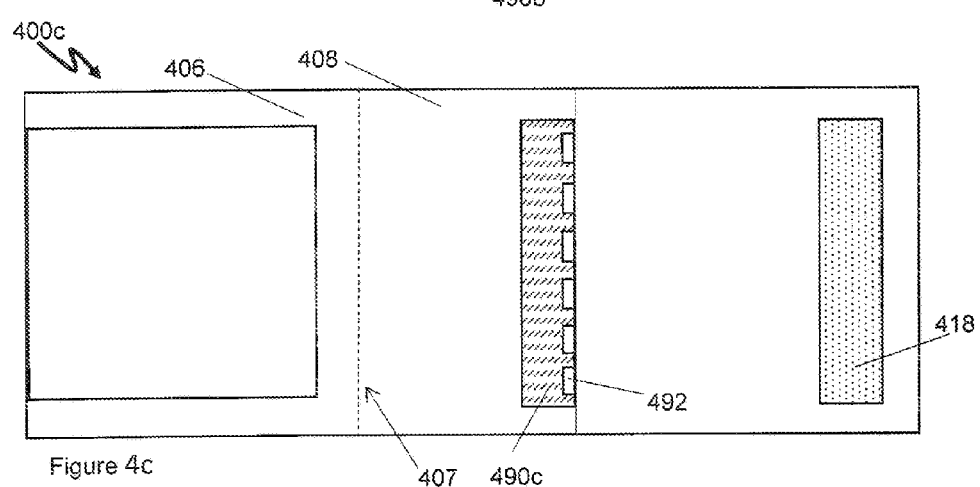
FIG. 4c shows a plan view of an integrated circuit arrangement with a crenelated metal strip configured to shorten the current return path.

FIG. 4*c* shows a plan view of another example of an integrated circuit arrangement 400*c* that corresponds to cross section views of FIGS. 2 and 3. In this example, the electrically conducting member 490*c* comprises a single strip of conductive material that may extend approximately the same length across the substrate (in the vertical direction as illustrated) as the output terminal 418 and the die 410. The electrically conducting member 490*c* is configured to provide at least one indentation. For example, the electrically conducting member 490*c* has a first indentation 499 formed in the side of the member 490*c* that faces towards the output terminal 418. It will be appreciated that other examples are possible in which two or more indentations are present.

In the arrangement 400*c* of FIG. 4*c*, the indentation 499 comprises a void in the electrically conducting material of the member 490*c* that extends from the cantilever portion 408 of the flange 406 to the substrate. An OMP package (not shown) may be configured to fill any indentations in the electrically conducting member 490*c*. The presence of the plastic material of the OMP package within the indentations may advantageously provide improved mechanical locking of the OMP package to the rest of the integrated circuit arrangement 400*c*. The member 490*c* may therefore project from the packages integrated circuit arrangement 400*c* for connection to the substrate.

It will be appreciated that in other examples an indentation in the electrically conducting member may only extend a portion of the distance between the substrate and the cantilever portion 408. It will also be appreciated that an indentation may extend through the electrically conducting member 490*c* from the side of the member 490*c* adjacent to the output terminal 418 to the side of the member 490*c* adjacent to the dotted line 407. Such an indentation comprises an aperture (not shown) through the member 490*c*. It will be appreciated that an OMP package may be configured to fill any such apertures and to extend beneath the cantilever portion 408 of the flange 406; such an arrangement may advantageously provide improved mechanical locking of the OMP package to the rest of the integrated circuit arrangement 400*c*.

Figure 5A:
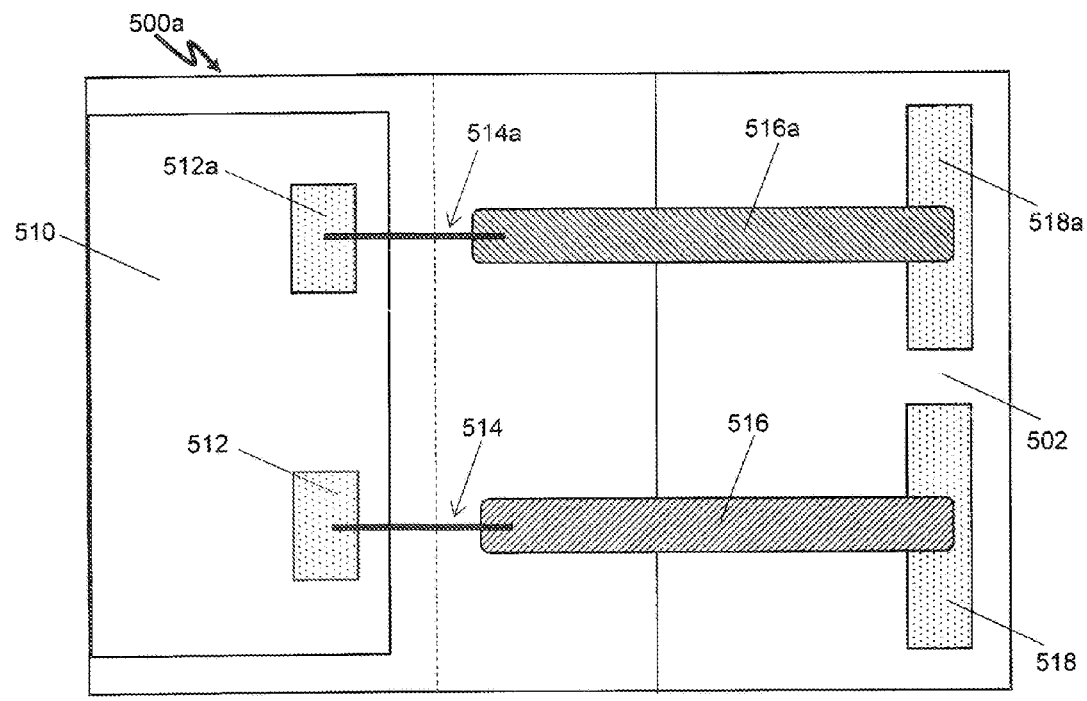
FIG. 5a shows a plan view of an integrated circuit arrangement with a die configured for two separate components.

FIG. 5*a* shows a plan view of an integrated circuit arrangement 500*a* corresponding to the cross section view of FIG. 1. Features in FIG. 5*a* that are similar to features in FIG. 1 have been given corresponding reference numerals and will not necessarily be described here to assist in the clarity of the disclosure. Illustration of the OMP has also been omitted to improve the clarity of the disclosure.

The integrated circuit arrangement 500*a* further comprises a second active component (not shown) on a die 510. The die 510 is electrically connected from a second die output terminal 512*a* via a second bond wire 514*a* to a second lead 516*a* that is electrically connected to a second output terminal 518*a* disposed on the PCB portion 502 of the substrate.

FIG. 5*a* therefore shows an integrated circuit arrangement 500*a* in which two separate active components may be included in the same package. The active components may be amplifiers, in which case the arrangement 500*a* may comprise a Doherty amplifier. It is desirable to include both a main amplifier and a peak amplifier of a Doherty amplifier within the same integrated circuit in order to minimize the overall size and weight of the device. However, the smaller the size of the overall arrangement, the less well electrically isolated from each other the peak and the main amplifier may be. Good isolation of the two amplifiers of a Doherty amplifier is necessary for the efficient operation of the Doherty amplifier.

Figure 5B:
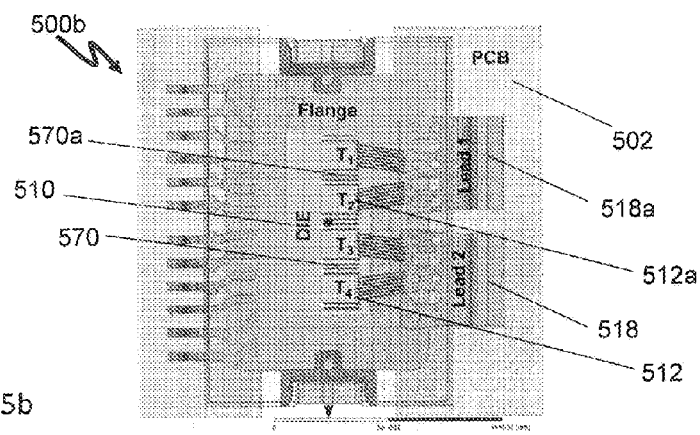
FIG. 5b shows a plan view of an integrated circuit arrangement comprising two separate amplifiers disposed on the same die.

FIG. 5*b* shows a more detailed plan view of an integrated circuit arrangement 500*b* corresponding to the integrated circuit arrangement 500*a* of FIG. 5*a*. Features in FIG. 5*b* that are similar to features in FIG. 5*a* have been given corresponding reference numerals and will not necessarily be described here to assist in the clarity of the disclosure.

The integrated circuit arrangement 500*b* comprises a first active component 570 connected to a die output terminal 512 and a second active component 570*a* connected to a second die output terminal 512*a*. The first active component 570 may be a first amplifier. The second active component 570*a* may be a second amplifier. In use, an excitation may be applied to the second active component 570*a* such that electrical current may flow from the second die output terminal 512*a* to the second output terminal 518*a*. Electrical current will therefore flow through a current return path from the PCB portion 502 of the substrate back to the die 510 and thereby back to the second active component 570*a*.

Figure 5C:
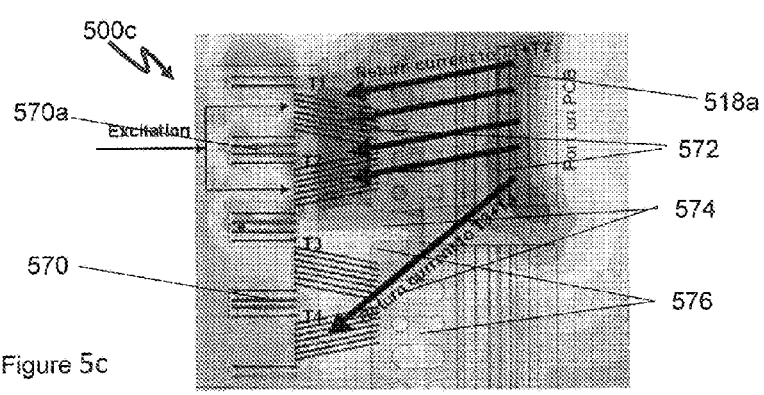
FIG. 5c shows a plan view of a simulation, of the integrated circuit arrangement of FIG. 5b, showing the return current flowing from a first amplifier circuit back to the first amplifier circuit and to the second amplifier circuit.

FIG. 5*c* shows results of a simulation 500*c* of return current density flowing in part of the integrated circuit arrangement of FIG. 5*b*, when the second active component 570*a* is supplying a current to the second output terminal 518*a*. First current density areas 572 have a high density of current. Second current density areas 574 have an intermediate density of current. Third current density areas 576 have a low density of current. FIG. 5*c* shows that, in use, a high density of current flows from the second output terminal 518*a* back to the second active component 570*a*. However, FIG. 5*c* also shows that at the same time an intermediate density of current flows from the second output terminal 518*a* to the first active component 570.

The simulation 500*c* shows a phenomenon comprising an undesirable coupling of the second active component 570*a* to the first active component 570. This may occur because there exists an inductive coupling between the current flow path of the first active component 570 and the current flow path of the second active component 570*a*. Reducing the inductance of the integrated circuit arrangement may therefore reduce the undesirable coupling. In particular, reducing the impedance between a terminal on the substrate and its corresponding output terminal on the die may reduce the coupling. This has been found to assist in isolating the current return paths of the two amplifiers from one another.

Figure 6A:
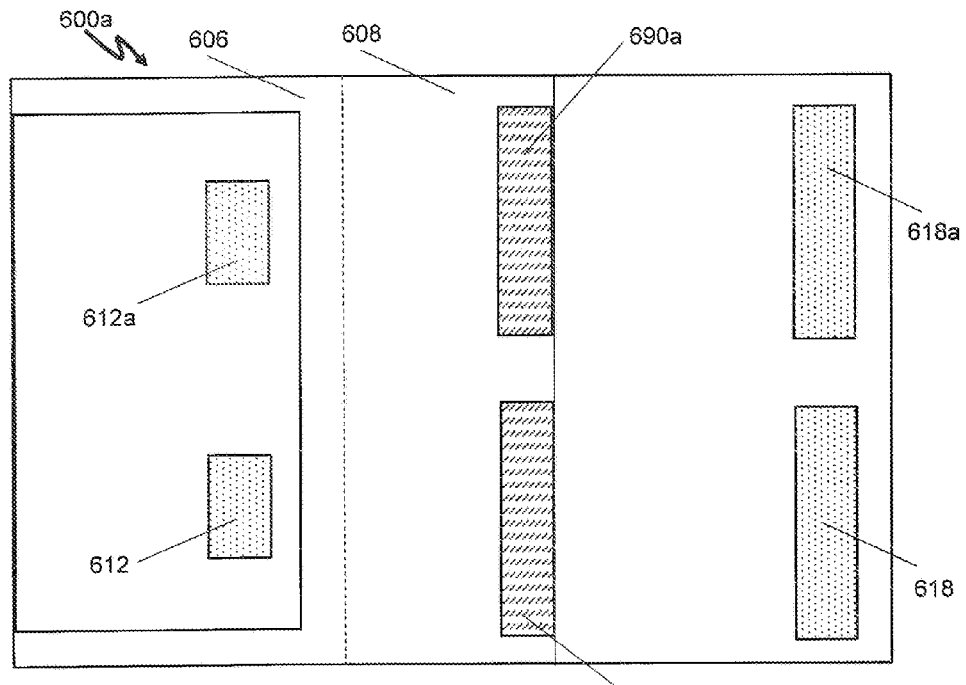
FIG. 6a shows a plan view of an integrated circuit arrangement comprising a die configured for two separate components and further comprising a pair of solid metal strips configured to improve the electrical isolation of the two separate components.

FIG. 6*a* shows a plan view of an integrated circuit arrangement 600*a* corresponding to the cross section view of FIG. 2 or 3. Features in FIG. 6*a* that are similar to features in earlier figures have been given corresponding reference numerals and will not necessarily be described here to assist in the clarity of the disclosure. Illustration of the OMP, leads and bond wires have also been omitted to improve the clarity of the disclosure.

The integrated circuit arrangement 600*a* comprises a first electrically conducting member 690 disposed between the die output terminal 612 and the output terminal 618 such that a shortened current return pathway is provided between the substrate and the cantilever portion 608 of the flange 606. The arrangement 600*a* further comprises a second electrically conducting member 690a disposed between the second die output terminal 612a and the second output terminal 618a such that a second shortened current return pathway is provided between the substrate and the cantilever portion 608 of the flange 606.

Figures 6B, 6C:
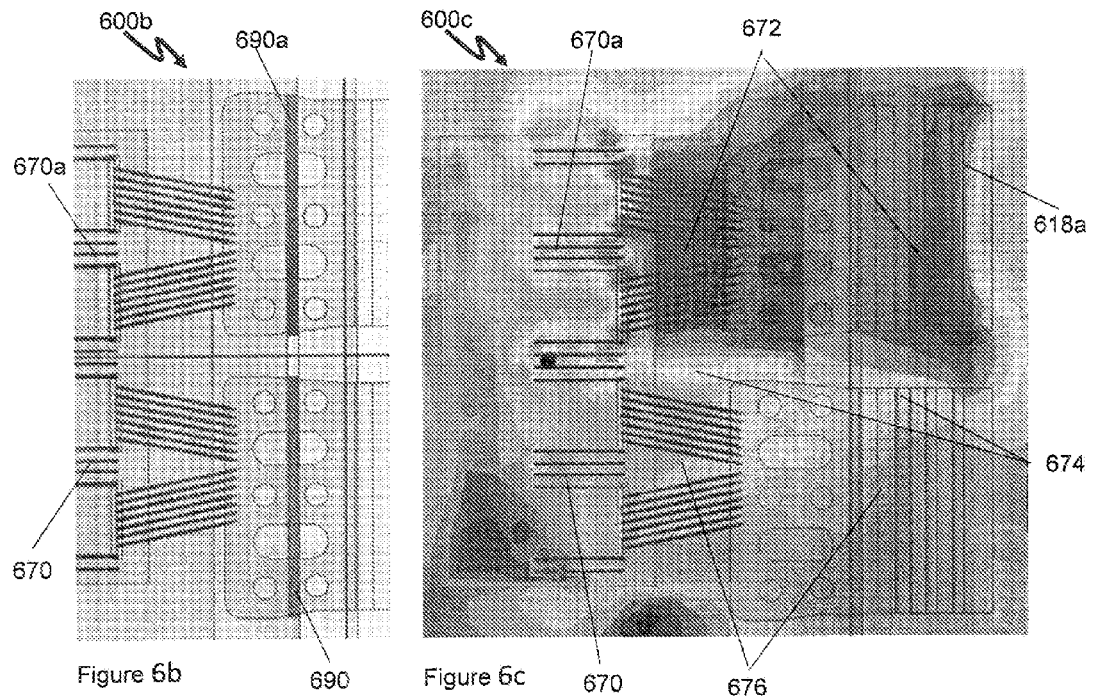
FIG. 6b shows a plan view of an integrated circuit arrangement comprising two separate amplifies disposed on the same die and further comprising a pair of solid metal strips configured to improve the electrical isolation of the two separate amplifiers.
FIG. 6c shows a plan view of a simulation, of the integrated circuit arrangement of FIG. 6b, showing the return current flowing from a first amplifier circuit back to the first amplifier circuit and to the second amplifier circuit.

FIG. 6b shows a more detailed plan view of an integrated circuit arrangement 600b corresponding to the integrated circuit arrangement 600a of FIG. 6a. Features in FIG. 6b that are similar to features in FIG. 6a have been given corresponding reference numerals and will not necessarily be described here to assist in the clarity of the disclosure. As in the arrangement 500b, arrangement 600b comprises a first active component 670 and a second active component 670a.

FIG. 6c shows results of a simulation 600c of return current density flowing in part of the integrated circuit arrangement 600b of FIG. 6b, when the second active component 670a is supplying a current to the second output terminal 618a. First current density areas 672 have a high density of current. Second current density areas 674 have an intermediate density of current. Third current density areas 676 have a low density of current. FIG. 6c shows that, in use, a high density of current flows from the second output terminal 618a back to the second active component 670a. However, FIG. 6c also shows that only a low current flows from the second output terminal 618a to the first active component 670. This shows that inclusion of the first electrically conducting member 690 and the second electrically conducting member 690a into the arrangement 600b leads to a substantial reduction in the coupling of the second active component 670a with the first active component 670. Thus, the provision of current return terminal(s) for each active component, provided by the electrically conducting members 690, 690a, is advantageous.

It will be appreciated that the reduction in coupling achieve by the integrated circuit arrangement 600b may be derived from use of electrically conducting members that comprise: a solid metal strip, as described in relation to FIG. 4a; a plurality of metal pins, as described in relation to FIG. 4b; or an indented metal strip, as described in relation to FIG. 4c. Simulations (not shown) of integrated circuit arrangements comprising a plurality of metal pins or indented metal strips have shown that these arrangements can be as effective in reducing inductive coupling between separate active components as the simulation discussed in relation to FIG. 6c.

By including electrically conducting members in the integrated circuit arrangement, as described above, it may be possible to make devices small while maintaining sufficient isolation between separate components to allow for high levels of efficiency. It will be appreciated that such arrangements may provide the same advantage when a single integrated circuit arrangement comprises more than two active components and where each of a plurality of components may advantageously be electrically isolated from each other component.

Figure 7A:
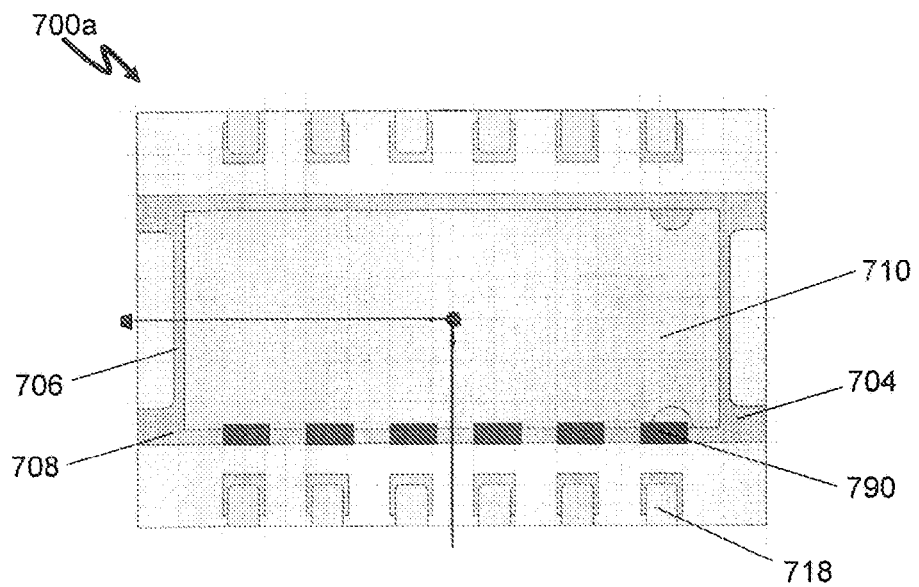
FIG. 7a shows a plan view of a Quad Flat No-leads integrated circuit arrangement incorporating a plurality of metal elements configured to improve electrical isolation.

FIG. 7a shows a plan view of a Quad Flat No-leads (QFN) integrated circuit arrangement 700a. The QFN arrangement 700a comprises an electrically conducting member 790 disposed between a die 710 and an output terminal 718 and configured to provide a shortened current return path between a heat sink portion 704 of a substrate and a cantilever portion 708 of a flange 706. It will be appreciated that such electrically conducting members may be provided for each output terminal in a QFN arrangement.

Figure 7B:
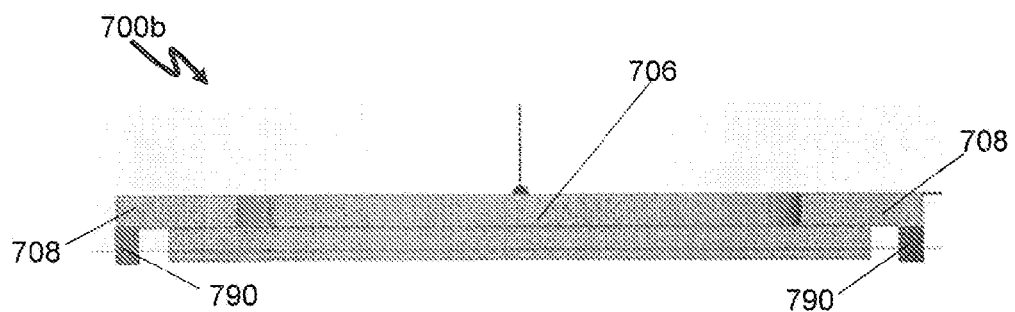
FIG. 7b shows a cross section view of Quad Flat No-leads integrated circuit arrangement.

FIG. 7b shows a cross section view of a QFN integrated circuit arrangement 700b. Electrically conductive members 790 provide for a shortened current return path by providing an electrical connection between the substrate and the cantilever portion 708 of the flange 706. This may provide a shorter current return path for each active component and may provide a reduction in the inductive coupling between separate active components within the arrangement 700b. This may advantageously provide an increase in efficiency of the QFN arrangement 700b. This may also advantageously result in a reduction in waste heat produced during the operation of the QFN arrangement 700b.

It is expected that integrated circuit arrangements incorporating shortened current return paths will prove successful across a broad range of applications, including in: communication systems, radio-frequency applications, mobile device applications, and base-station applications.

The invention claimed is:

1. An integrated circuit arrangement, for use with a substrate, comprising:
a flange for disposition on top of the substrate, the flange comprising a cantilever portion configured to project over the substrate;
a die disposed on top of the flange;
a first lead configured to provide for an electrical connection between the die and a first output terminal disposed on the substrate;
a first electrically conducting member configured to provide at least part of a current return path between the substrate and the die and arranged to bridge a gap between the cantilever portion and the substrate.

2. The integrated circuit arrangement of claim 1, wherein:
the substrate comprises a heat sink portion and a Printed Circuit Board portion adjacent to the heat sink portion;
the flange is disposed on top of the heat sink portion and the cantilever portion is configured to project over the Printed Circuit Board portion;
the first electrically conducting member is configured to extend through the Printed Circuit Board portion to the cantilever portion.

3. The integrated circuit arrangement of claim 1, wherein:
the substrate comprises a heat sink portion and a Printed Circuit Board portion adjacent to the heat sink portion;
the flange is disposed on top of the heat sink portion and the cantilever portion is configured to project over the heat sink portion;
the first electrically conducting member is configured to extend between the heat sink portion and the cantilever portion.

4. The integrated circuit arrangement of claim 1, wherein the cantilever portion comprises a proximal end, adjacent to the die, and a distal end, adjacent to the first output terminal, and the first electrically conducting member is electrically coupled to the distal end of the cantilever portion.

5. The integrated circuit arrangement of claim 1, wherein the first electrically conducting member comprises a strip of conductive material.

6. The integrated circuit arrangement of claim 1, wherein the first electrically conducting member comprises a plurality of electrically conductive pins.

7. The integrated circuit arrangement of claim 1, wherein the first electrically conducting member comprises a strip of conductive material having indentations.

8. The integrated circuit arrangement of claim 1 further comprising an Over-Moulded-Plastic package configured to encapsulate:
the flange, including the cantilever portion of the flange;
the die;
at least a portion of the first lead;
at least a portion of the first electrically conducting member; and wherein the encapsulation provides for a gap between the Over-Moulded-Plastic package and the substrate.

9. The integrated circuit arrangement of claim 1, further comprising an Over-Moulded-Plastic package configured to encapsulate:
the flange, including the cantilever portion of the flange;
the die;
at least a portion of the first lead;
the first electrically conducting member; and
wherein the encapsulation provides direct contact between the Over-Moulded-Plastic package and the substrate.

10. The integrated circuit arrangement of claim 1, further comprising:
a second lead configured to provide a separate electrical connection between the die and a second output terminal disposed on the substrate remote from the first output terminal;
a second electrically conducting member configured to provide at least part of a second current return path between the substrate and the die and arranged to bridge a gap between the cantilever portion and the substrate;
wherein the first electrically conducting member is disposed between the die and the first output terminal and is configured to enable electrical current to flow from the substrate to the cantilever portion of the flange and the second electrically conducting member is disposed between the die and the second output terminal and is configured to enable electrical current to flow from the substrate to the cantilever portion of the flange.

11. The integrated circuit arrangement of claim 10, further comprising:
a first active component disposed on the die, configured to supply and/or receive an electrical signal from the first lead; and
a second active component disposed on the die, distinct from the first active component, configured to supply and/or receive an electrical signal from the second lead.

12. The integrated circuit arrangement of claim 11, wherein:
the first active component comprises a transistor and/or an amplifier;
the second active component comprises a transistor and/or an amplifier; and
wherein, the first electrically conducting member and the second electrically conducting member are configured to electrically isolate the first active component from the second active component.

13. The integrated circuit arrangement of claim 11, comprising a Doherty amplifier, wherein:
the first active component is configured to comprise a peak amplifier; and
the second active component is configured to comprise a main amplifier.

14. A Quad Flat No-leads integrated circuit arrangement comprising the integrated circuit arrangement of claim 1.

15. A communications device, radio-frequency device, mobile device or base-station device comprising the integrated circuit arrangement of claim 1.

* * * * *